(12) United States Patent
Zhang et al.

(10) Patent No.: US 7,502,879 B2
(45) Date of Patent: Mar. 10, 2009

(54) INTEGRATED CIRCUITS WITH INTERCHANGEABLE CONNECTORS

(75) Inventors: YunDong Zhang, Beijing (CN); Jun Zhu, San Jose, CA (US); Guoxin Li, Beijing (CN); Jian-Xun Yao, Beijing (CN)

(73) Assignee: Vimicro Corporation, Beijing (CN)

( * ) Notice: Subject to any disclaimer, the term of this patent is extended or adjusted under 35 U.S.C. 154(b) by 323 days.

(21) Appl. No.: 11/252,277

(22) Filed: Oct. 17, 2005

(65) Prior Publication Data

US 2007/0086254 A1    Apr. 19, 2007

(51) Int. Cl.
*G06F 13/12* (2006.01)
(52) U.S. Cl. ......................................................... 710/62
(58) Field of Classification Search .................. 710/62; 365/210, 222; 625/30, 41
See application file for complete search history.

(56) References Cited

U.S. PATENT DOCUMENTS 4,603,320 A * 7/1986 Farago ........................ 341/89
5,594,365 A * 1/1997 Agrawal et al. ................ 326/40
6,065,679 A * 5/2000 Levie et al. ............. 235/462.47
6,615,402 B2 * 9/2003 Kaneko et al. ................. 716/16

* cited by examiner

*Primary Examiner*—Henry W Tsai
*Assistant Examiner*—John B Roche
(74) *Attorney, Agent, or Firm*—Joe Zheng

(57) ABSTRACT

Techniques for interchanging positions of external terminals of an integrated circuit chip are disclosed. According to one aspect of the present invention, a chip comprises at least a pair of external terminals for communicating with other components or circuits, an internal circuit and an interchangeable unit coupled between the external terminals and the internal circuit. The interchangeable unit is configured to interchange the external terminals electronically such that the chip remains compatible in various versions involving an change of the terminals thereof, wherein the an interchangeable unit is controllable externally by a selecting pin applicable to either a high level or a low level to cause the external terminals interchanged.

18 Claims, 5 Drawing Sheets

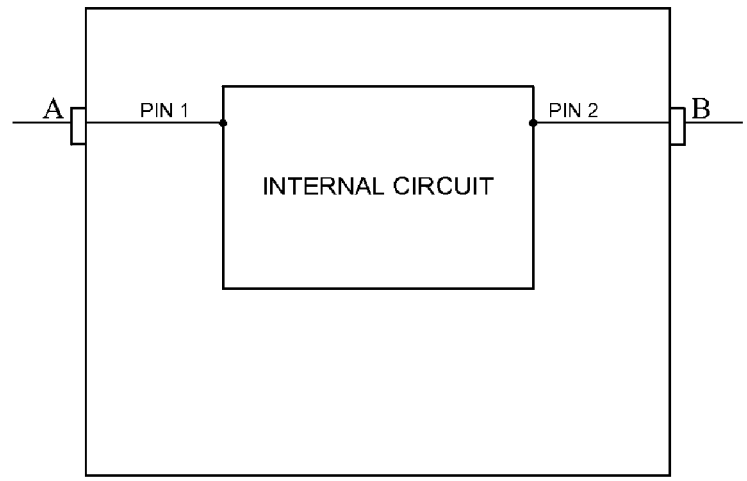
Prior Art  FIG. 1
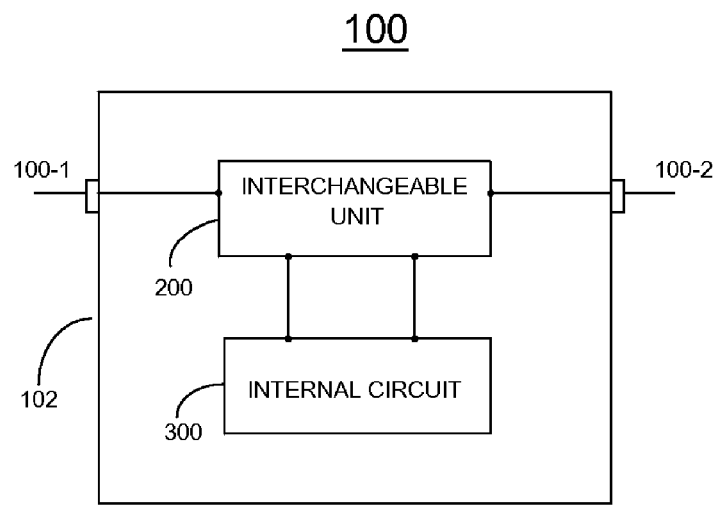
FIG. 2

INTEGRATED CIRCUITS WITH INTERCHANGEABLE CONNECTORS

BACKGROUND OF THE INVENTION

1. Field of the Invention

The present invention relates to integrated circuit (IC) chip designs, and more particularly to circuits facilitating to interchange external connectors or terminals of an IC chip.

2. Description of Related Art

FIG. 1 schematically shows an IC chip configuration comprising a package and an internal circuit. Around the package, a plurality of external connectors or terminals is disposed. For explanation simplicity, only two external terminals A, B are shown in FIG. 1. The external terminal A is electrically connected with pin 1 of the internal circuit for transferring data between an external device and the internal circuit. Correspondingly, the external terminal B is electrically connected with pin 2 of the internal circuit for the similar purpose.

In the course of chip designs requiring to continuously update the design solutions, there will be different versions in a kind of chips. Different versions may result in different layouts of the external terminals in the same kind of chips. However, in some applications, the application circumstance of the chips does not change along with the versions of the chips, thereby sometimes causing an updated version of the chips to be incompatible with the original version.

Thus there is a need for techniques for interchanging the external terminals of chips in order to increase the compatibility of the chips.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to techniques for interchanging positions of external terminals of a chip. According to one aspect of the present, an integrated circuit chip includes at least a pair of external terminals for communicating with other components or circuits, an internal circuit providing main functions of the chip, and an interchangeable unit. The interchangeable unit is provided between the terminals and the internal circuit such that the chip remains compatible in various versions involving an change of the terminals thereof, wherein the an interchangeable unit is controllable externally by a selecting pin applicable to either a high level or a low level to cause the external terminals interchanged.

The present invention may be implemented in many forms including a circuit, a method, or as a part of a device or system. According to one embodiment, the present invention is an integrated circuit chip. The chip comprises at least a pair of external terminals for communicating with other components or circuits, an internal circuit providing main functions of the chip, an interchangeable unit, provided between the terminals and the internal circuit, including at least first, second, third and fourth signal pins for signal transference and a selecting pin, the first and second signal pins connecting with the external terminals, the third and fourth signal pins connecting with the internal circuit, and wherein the selecting pin is controlled to cause the first signal pin to be electrically connected with the third signal pin and the second signal pin to be electrically connected with the fourth signal pin to interchange the external terminals of the chip.

According to another embodiment, the present invention is an integrated circuit chip that comprises at least a pair of external terminals for communicating with other components or circuits; an internal circuit providing main functions of the chip; an interchangeable unit, provided between the terminals and the internal circuit, configured to interchange the external terminals electronically such that the chip remains compatible in various versions involving an change of the terminals thereof, wherein the an interchangeable unit is controllable externally by a selecting pin applicable to either a high level or a low level to cause the external terminals interchanged.

One of the objects, features, and advantages of the present invention is to facilitate interchanging electronically external connectors or terminals of an IC chip.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 1 is a block diagram schematically showing a conventional chip;

FIG. 2 is a block diagram schematically showing a chip of the present invention;

FIGS. 5, 6 both are a block diagram schematically showing the chip which the one embodiment of the interchangeable unit is disposed in; and FIG. 7 is a block diagram schematically showing the chip which the other embodiment of the interchangeable unit is disposed in.

DETAILED DESCRIPTION OF THE INVENTION

Figure 3:
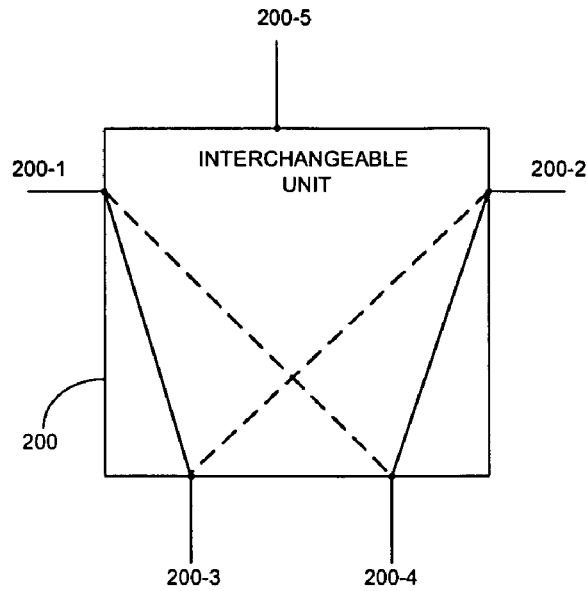
FIG. 3 is a diagram showing a general structure of an interchangeable unit in the chip of the present invention.

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Referring now to the drawings, in which like numerals refer to like parts throughout the several views. FIG. 2 shows a chip 100 comprising a package 102, an internal circuit 300 and an interchangeable unit 200 disposed between the package 102 and the internal circuit 300. Around the package 102, a plurality of external terminals is disposed. In FIG. 2, only two external terminals 100-1 and 100-2 are shown for explanation simplicity.

The interchangeable unit 200 is configured for interchanging positions of the external terminals 100-1 and 100-2 in some certain applications. FIG. 3 schematically shows a general structure of the interchangeable unit 200. The interchangeable unit 200 has one group of signal pins 200-1 and 200-2, the other group of signal pins 200-3 and 2004, and a selecting pin 200-5. The value of the selecting pin 200-5 has two status, one is "H"(high level), the other is "L"(low level). In one embodiment, when the selecting pin 200-5 is set to "L", the signal pin 200-1 is electrically connected with the signal pin 200-3 while the signal pin 200-2 is electrically connected with the signal pin 2004. When the selecting pin 200-5 is set to "H", the signal pin 200-1 is electrically connected with the signal pin 200-4 and the signal pin 200-2 is electrically connected with the signal pin 200-3.

Figure 4:
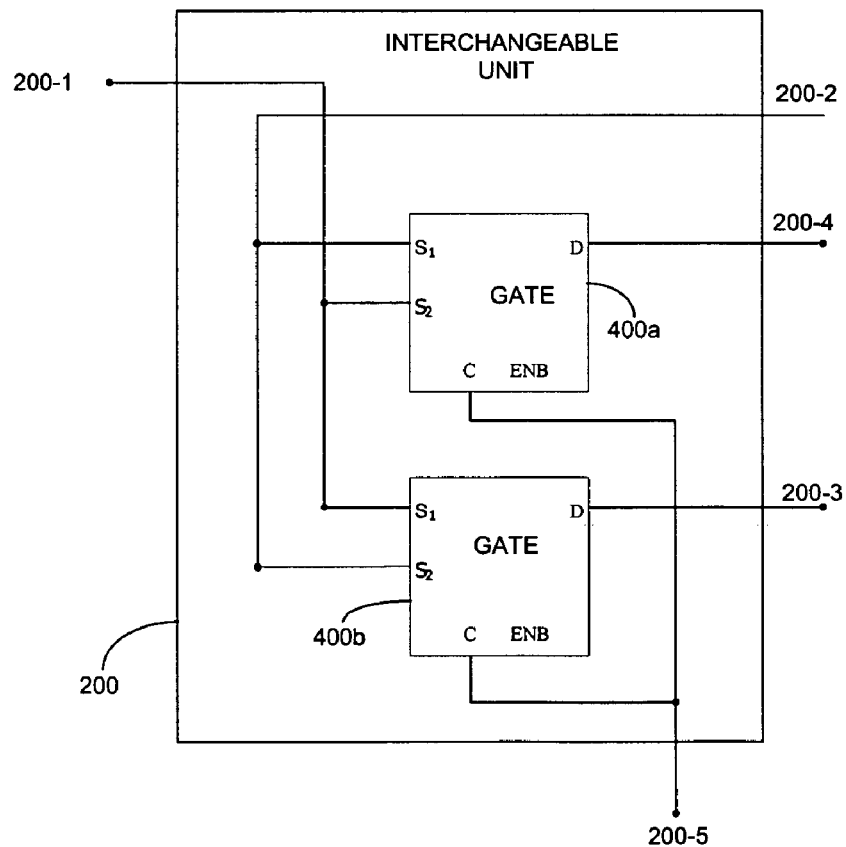
FIG. 4 shows one embodiment of the interchangeable unit.

Depending on applications, the interchangeable unit 200 may have various different configurations. FIG. 4 shows one embodiment of the interchangeable unit 200. The interchangeable unit 200 comprises a pair of gates 400a and 400b, each has a pair of input nodes S1 and S2, an output node D and a controlling node C. The signal pin 200-1 is electrically connected with the input node S2 of the gate 400a and the input node S1 of the gate 400b. The signal pin 200-2 is electrically connected with the input node S1 of the gate 400a and the input node S2 of the gate 400b, respectively. The controlling nodes C of the gates 400a and 400b are electrically connected with the selecting pin 200-5. The output node D of the gates 400a and 400b are electrically connected with the signal pin 200-4 and 200-3, respectively.

In operation, when the selecting pin 200-5 is set to "L", that means that the controlling nodes C of the gates 400a, 400b are both set to "L". The input node S1 of either the gate 400a or 400b is selected to be electrically connected with the output node D, as a result, the signal pin 200-1 is electrically connected with the signal pin 200-3 by the gate 400b and the signal pin 200-2 is electrically connected with the signal pin 200-4 by the gate 400a. When the selecting pin 200-5 is set to "H", that means that the controlling node C is "H". The input nodes S2 of either the gate 400a or 400b is selected to electrically connected with output node D, as a result, the signal pin 200-1 is electrically connected with the signal pin 200-4 by the gate 400a and the signal pin 200-2 is electrically connected with the signal pin 200-3 by the gate 400b.

Figure 5:
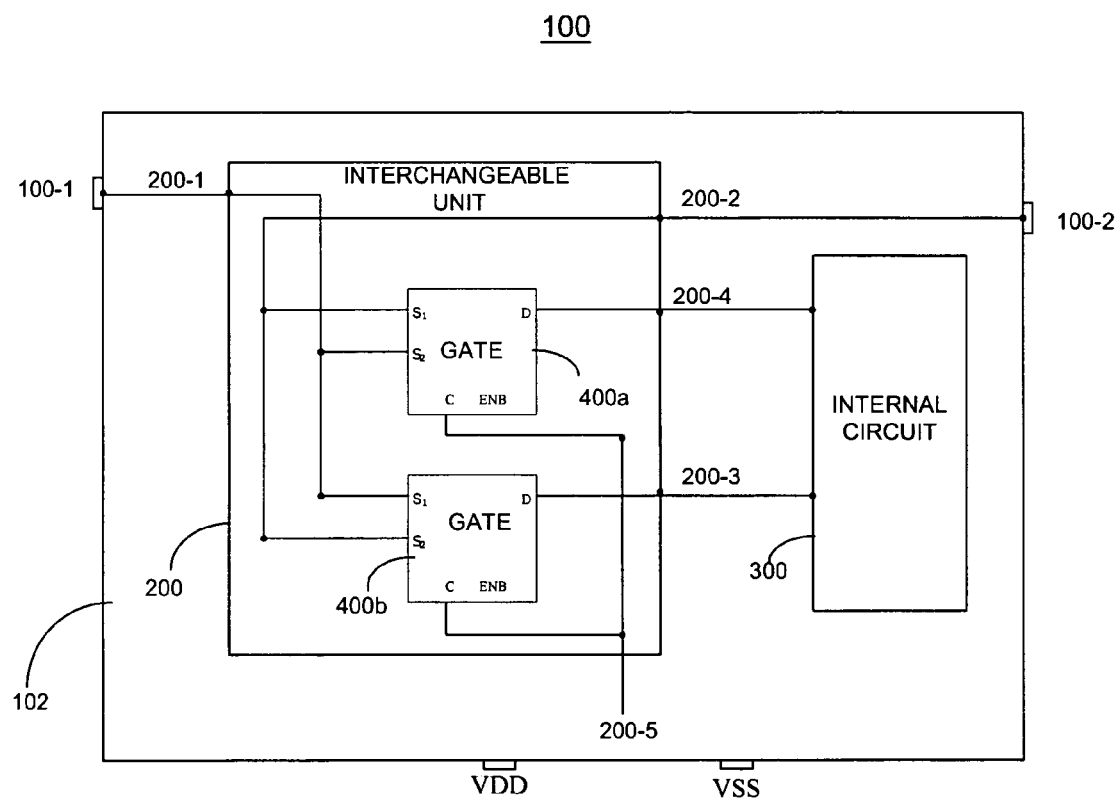

Referring now to FIG. 5, there shows a block diagram of a chip 100 employing the present invention. The chip 100 includes an internal circuit 300 that provides main functions of the chip. The external terminals 100-1 and 100-2 are electrically connected with the signal pins 200-1 and 200-2, respectively. The signal pins 200-3 and 200-4 are electrically connected with the internal circuit 300. It is assumed that the signal pins 200-1 and 200-2 are to receive one or more input signals.

When the selecting pin 200-5 is set to "L", an input signal from the external terminal 100-1 is led to the signal pin 200-3 by the gate 400b and an input signal from the external terminal 100-2 is led to the signal pin 200-4 by the gate 400a. When the selecting pin 200-5 is set to "H", the input signal from the external terminal 100-1 is led to the signal pin 200-4 by the gate 400a and the input signal from the external terminal 100-2 is led to the signal pin 200-3 by the gate 400b. Consequently, the chip 100 shown in the FIG. 5 can be readily compatible in versions that result in changes of the terminals by employing an interchangeable unit that is controllable by a selecting pin. In one embodiment, the value of the selecting pin 200-5 is realized by connecting the selecting pin 200-5 to a power source or a grounding terminal of the chip 100.

Figure 6:
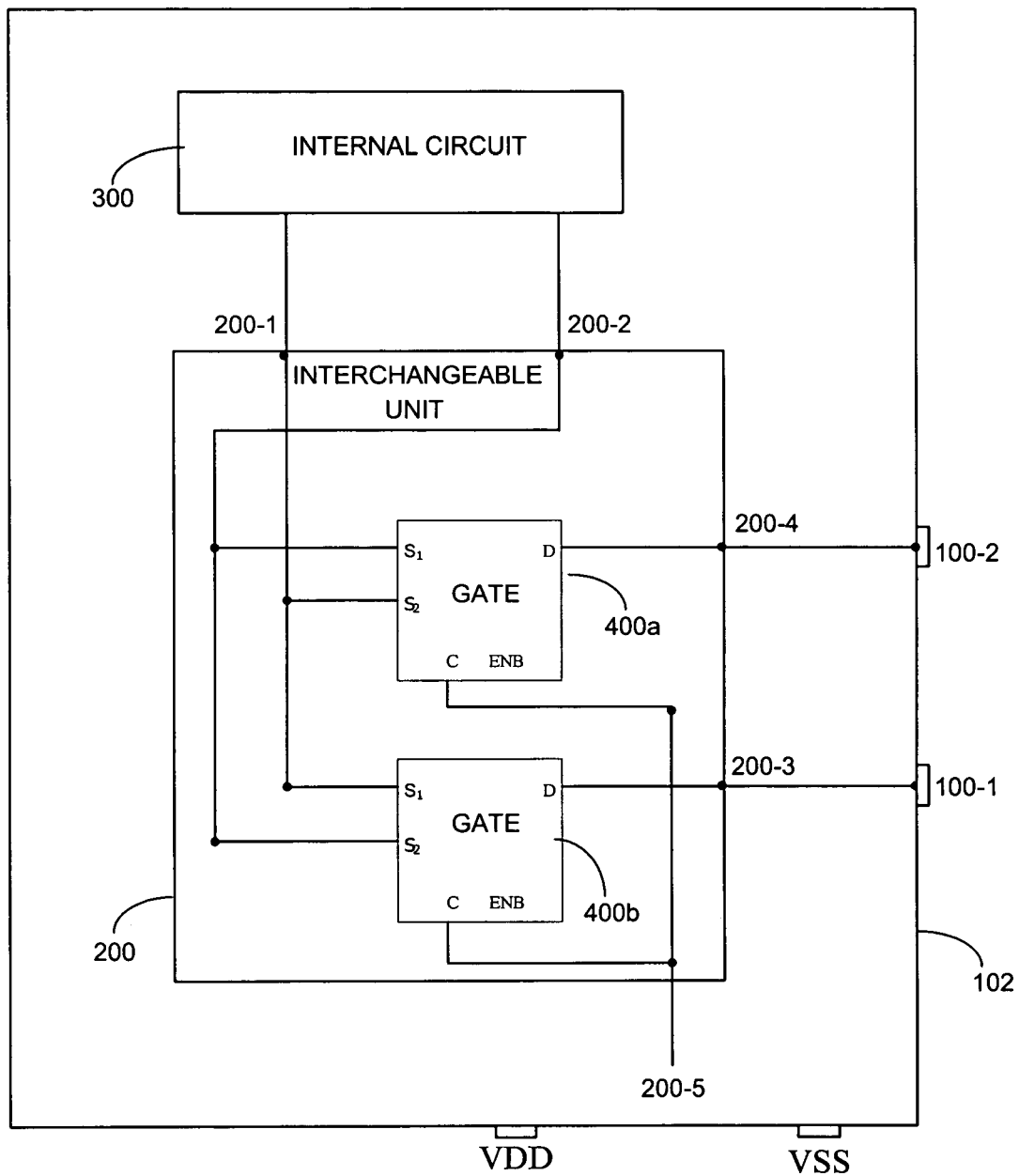

Referring now to FIG. 6, there shows another block diagram of a chip 100 employing the present invention. The chip 100 includes an internal circuit 300 that provides main functions of the chip. The external terminals 100-1 and 100-2 are electrically connected with the signal pins 200-3 and 200-4, respectively. The signal pins 200-1 and 200-2 are electrically connected with the internal circuit 300. It is assumed that the signal pins 200-1 and 200-2 are to receive one or more output signals. When the selecting pin 200-5 is set to "L", an output signal from the signal pin 200-1 is led to the external terminal 100-1 by the gate 400b and an output signal from the signal pin 200-2 is led to the external terminal 100-2 by the gate 400a. When the selecting pin 200-5 is set to "H", the output signal from the signal pin 200-1 is led to the external terminal 100-2 by the gate 400a and the output signal from the signal pin 200-2 is led to the external terminal 100-1 by the gate 400b. Consequently, the chip 100 shown in the FIG. 6 can be readily compatible in versions that result in changes of the terminals by employing an interchangeable unit that is controllable by a selecting pin.

Figure 7:
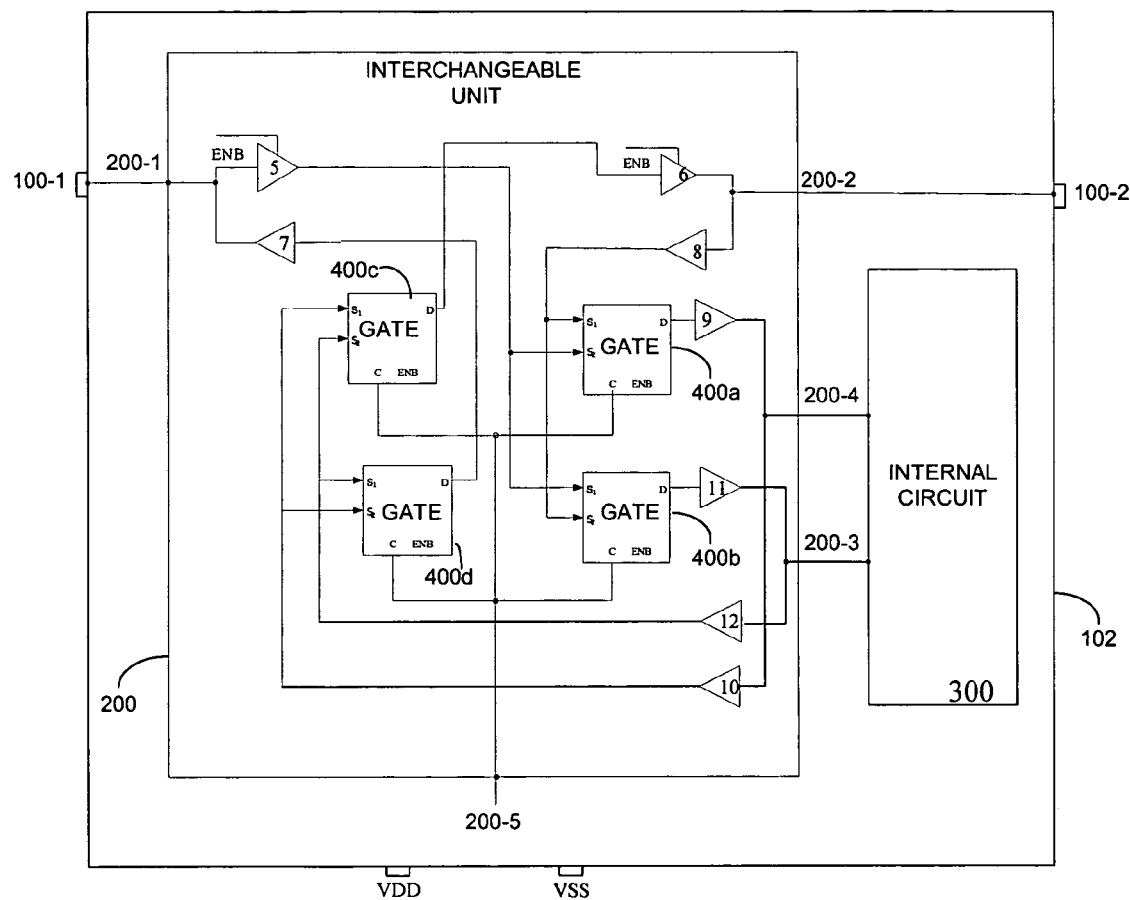

Referring now to FIG. 7, there shows still another block diagram of a chip 100 employing the present invention. The chip 100 includes an internal circuit 300 that provides main functions of the chip. The external terminals 100-1, 100-2 are electrically connected with the signal pins 200-1, 200-2, respectively. The signal pins 200-4, 200-3 are electrically connected with the internal circuit 300, where the signal between the external terminals 100-1, 100-2 and the internal circuit 300 is assumed to be one or more bidirectional signals.

As shown in FIG. 7, the interchangeable unit 200 includes two pairs of gates 400a, 400b, 400c, and 400d each of which is substantially similar to that described above. The signal pin 200-1 is electrically connected with the input node S2 of the gate 400a and the input node S1 of the gate 400b by an input buffer 5 in series. The signal pin 200-2 is electrically connected with the input node S1 of the gate 400a and the input node S2 of the gate 400b by an input buffer 8 in series. The output nodes D of the gates 400a and 400b are electrically connected with the signal pins 200-4 and 200-3 by input buffers 9 and 11 in series, respectively. Accordingly, the signal pin 200-3 is electrically connected with the input node S1 of the gate 400d and the input node S2 of the gate 400c by an output buffer 12 in series. The signal pin 200-4 is electrically connected with the input node S2 of the gate 400d and the input node S1 of the gate 400c by an output buffer 10 in series. The output nodes D of the gates 400c and 400d are electrically connected with the signal pins 200-2 and 200-1 by output buffers 6, 7 in series, respectively. The controlling nodes C of the gates 400a, 400b, 400c, and 400d are electrically connected with the selecting pin 200-5.

When the selecting pin 200-5 is set to "L", that means that the controlling nodes C of all gate are "L", in this status, the input nodes S1 of all gate 400 are selected to electrically connected with the output node D, thereby an input signal from the external terminal 100-1 is led to the signal pin 200-3 by the gate 400b and an output signal from the signal pin 200-3 is led to the external terminal 100-1 by the gate 400d, and an input signal from the external terminal 100-2 is led to the signal pin 200-4 by the gate 400a and an output signal from the signal pin 200-4 is led to the external terminal 100-2 by the gate 400c.

When the selecting pin 200-5 is set to "H", that means that the controlling nodes C of all gate are "H", in this status, the input nodes S2 of all gate 400 are selected to electrically connected with the output node D, thereby the input signal from the external terminal 100-1 is led to the signal pin 200-4 by the gate 400*a* and the output signal from the signal pin 200-4 is led to the external terminal 100-1 by the gate 400*d*, and the input signal from the external terminal 100-2 is led to the signal pin 200-3 by the gate 400*b* and the output signal from the signal pin 200-3 is led to the external terminal 100-2 by the gate 400*c*.

It can be appreciated that the chip 100 shown in the FIG. 7 can be readily compatible in versions that result in changes of the terminals by employing an interchangeable unit that is controllable by a selecting pin.

According to the above descriptions, it can be appreciated that one or more interchangeable units may be employed in a chip so that the positions of the external terminals can be interchanged. Hence, the compatibility of chips may be increased in view of various versions thereof.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. An integrated circuit chip pertaining to an application-specific integrated circuit (ASIC), the integrated circuit chip comprising:
    at least a pair of external terminals for communicating with other components or circuits;
    an internal circuit providing main functions of the chip;
    an interchangeable circuit, provided between the terminals and the internal circuit, including at least first, second, third and fourth signal pins for signal transference and a selecting pin, the first and second signal pins connecting with the external terminals, the third and fourth signal pins connecting with the internal circuit, wherein the external terminals of the chip remain unchanged via the interchangeable circuit despite of different layouts of an internal circuit causing changes to the third and fourth signal pins so that the integrated circuit chip remains compatible despite changes to the terminals thereof, wherein the interchangeable circuit includes first and second gates, each of the gates having first and second inputs and one output, the first input of the first gate and the second input of the second gate are coupled to the first signal pin, the second input of the first gate and the first input of the second gate are coupled to the second signal pin, the output of the first gate is coupled to the third signal pin and the output of the second gate is coupled to the fourth signal pin, further, a control node of the gates is coupled to the selecting pin, and
    wherein the selecting pin is applied to a control signal to cause the first signal pin to be electrically connected with the third signal pin and the second signal pin to be electrically connected with the fourth signal pin to interchange the external terminals of the chip through an operation of the gates controlled by the control signal.

2. The chip as claimed in claim 1, wherein, when a value of the selecting pin is set to one of L (Low Level) and H (High Level), the first signal pin is electrically connected with the third signal pin and the second signal pin is electrically connected with the fourth signal pin, and alternatively, when the value of the selecting pin is set to other one of L and H, the first signal pin is electrically connected with the fourth signal pin and the second signal pin is electrically connected with the third signal pin.

3. The chip as claimed in claim 1, wherein, when the selecting pin is set to "L", hence both of the gates are set to "L", the first input of either the first or the second gate is selected to be electrically connected with an output thereof, as a result, the first signal pin is electrically connected with the third signal pin and the second signal pin is electrically connected with the fourth signal pin, or when the selecting pin is set to "H", hence both of the gates are set to "H", the second input of either the first gate or the second gate is selected to electrically connected with an output thereof, as a result, the first signal pin is electrically connected with the fourth signal pin and the second signal pin is electrically connected with the third signal pin.

4. The chip as claimed in claim 1, wherein, when the controlling node is set to one of L and H, one input node is selected to be connected with the output node, when the controlling node is set other one of L and H, the other input node is selected to connect with the output node.

5. The chip as claimed in claim 4, wherein a first input buffer is coupled between the first signal pin and one of input nodes of the gates respectively, there is connected in series, and a second input buffer is coupled between an output node of the gates, respectively, and one of the third and fourth signal pins.

6. The chip as claimed in claim 1, wherein the interchangeable unit includes a pair of gates, the third signal pin is electrically connected with one input node of the gates, the fourth signal pin is electrically connected with another input node of the gates, output nodes of the gates are further electrically connected with the first and second signal pins, respectively, the selecting pin is electrically connected with a controlling node of the gates.

7. The chip as claimed in claim 6, wherein a first output buffer is coupled between the third signal pin and one input node of the gates, a second output buffer is coupled between the fourth signal pin and another input node of the gates, and a third output buffer is coupled between an output node of the gates and one of the first and second signal pins, respectively.

8. An interchangeable circuit, being disposed in an integrated circuit chip pertaining to an application-specific integrated circuit (ASIC), to interchange positions of external terminals of the chip, for keeping the external terminals of the chip unchanged despite of different layouts of an internal circuit in the integrated circuit chip causing otherwise changes to the external terminals, the interchangeable circuit comprising:
    first, second, third and fourth signal pins for transferring signal;
    a selecting pin;
    first and second gates. each of the gates having first and second inputs and one output, the first input of the first gate and the second input of the second gate coupled to the first signal pin, the second input of the first gate and the first input of the second gate coupled to the second signal pin, the output of the first gate is coupled to the third signal pin and the output of the second gate is coupled to the fourth signal pin, further, a control node of the gates coupled to the selecting pin,
    wherein, when the selecting pin is applied to a control signal that is set to be one of L (Low Level) and H (High Level), the first signal pin is electrically connected with the third signal pin, and the second signal pin is electrically connected with the fourth signal pin, when the control signal is set to be the other one of L and H, the first signal pin is electrically connected with the fourth signal pin, and the second signal pin is electrically connected with the third signal pin.

9. The interchangeable circuit as claimed in claim 8, wherein the value of the selecting pin is realized by being connected to a power source terminal or a grounding terminal.

10. The interchangeable circuit as claimed in claim 8, wherein the interchangeable unit comprises a pair of gates each having a pair of input nodes, an output node and a controlling node, the first signal pin is electrically connected with one input node of the gates, the second signal pin is electrically connected with another input node of the respective gates, the output nodes of the gates are electrically connected with the third and fourth signal pins, respectively, the selecting pin is electrically connected with the controlling node of either gate.

11. The interchangeable circuit as claimed in claim 10, wherein, when the controlling node is one of L and H, one input node is selected to connect with the output node, when the controlling node is another one of L and H, the other input node is selected to connect with the output node.

12. The interchangeable circuit as claimed in claim 10, wherein a first input buffer is coupled between the first signal pin and the one input node of the respective gates; a second input buffer is coupled between the second signal pin and the other input node of either gate, and a third input buffer is coupled between an output node of the respective gates and one of the third and fourth signal pins.

13. The interchangeable circuit as claimed in claim 9, wherein the interchangeable unit comprises a pair of gates, the third signal pin is electrically connected with one input node of either gate, the fourth signal pin is electrically connected with the other input node of either gate, the output nodes of the gates are electrically connected with the first and second signal pins, respectively, the selecting pin is electrically connected with the controlling node of either gate.

14. The interchangeable circuit as claimed in claim 13, wherein between the third signal pin and the one input node of either gate, an out buffer is connected in series; between the fourth signal pin and the other input node of either gate, an output buffer is connected in series; between the output node of either gate and one of the first and second signal pins, an output buffer is connected in series.

15. An integrated circuit chip pertaining to an application-specific integrated circuit (ASIC), the integrated circuit chip comprising:
at least a pair of external terminals for communicating with other components or circuits;
an internal circuit providing main functions of the chip;
an interchangeable unit, provided between the terminals and the internal circuit and controlled by a selecting pin applied to a control signal, configured to interchange the external terminals electronically such that the chip remains compatible in various versions involving a change of the terminals thereof, wherein the interchangeable unit includes first and second gates, each of the gates having first and second inputs and one output, the first input of the first gate and the second input of the second gate are coupled to the first signal pin, the second input of the first gate and the first input of the second gate are coupled to the second signal pin, the output of the first gate is coupled to the third signal pin and the output of the second gate is coupled to the fourth signal pin, further, a control node of the gates is coupled to the selecting pin that is applicable to either a high level or a low level to cause the external terminals interchanged through the first and second gates so that the integrated circuit chip remains compatible despite changes to the terminals thereof.

16. The integrated circuit chip as claimed in claim 15, wherein the interchangeable unit includes at least first, second, third and fourth signal pins, and the integrated circuit chip includes at least two external terminals for communicating with other components or circuits.

17. The integrated circuit chip as claimed in claim 16, wherein the interchangeable unit is controlled to make appropriate interconnections among the first, second, third and fourth signal pins, such that the two external terminals are exchanged.

18. The integrated circuit chip as claimed in claim 17, where, under a predefined voltage, the third signal pin and the second signal pin are electrically connected with the fourth signal pin, respectively, and alternatively, the first signal pin is electrically connected with the fourth signal pin and the second signal pin is electrically connected with the third signal pin, respectively.

* * * * *